United States Patent [19]

Satoh

[11] Patent Number: 5,055,947
[45] Date of Patent: Oct. 8, 1991

[54] CASSETTE FOR STORING DATA IN A SOLID STATE MEMORY IN LIEU OF TAPE

[75] Inventor: Takateru Satoh, Saku, Japan

[73] Assignee: TDK Corporation, Tokyo, Japan

[21] Appl. No.: 369,019

[22] Filed: Jun. 21, 1989

[30] Foreign Application Priority Data

Jul. 6, 1988 [JP] Japan ............................ 63-89686[U]

[51] Int. Cl.⁵ ..................... G11B 15/12; G11B 5/03; G11B 23/02
[52] U.S. Cl. .................................. 360/62; 360/66; 360/132; 360/137
[58] Field of Search ................ 360/62, 137, 132, 66

[56] References Cited

U.S. PATENT DOCUMENTS 4,592,014  5/1986  Akiba et al. ........................... 365/1
4,628,373  12/1986 Takahashi et al. .................... 360/62

FOREIGN PATENT DOCUMENTS 2854401  6/1980  Fed. Rep. of Germany .......... 365/1

*Primary Examiner*—John H. Wolff
*Assistant Examiner*—Varsha V. Sheladia
*Attorney, Agent, or Firm*—Oblon, Spivak, McClelland, Maier & Neustadt

[57] ABSTRACT

A cassette type recording unit comprises a cassette casing, an IC memory, a magnetism-electricity transducer capable of magnetically coupling to a recording-/reproducing head of the magnetic tape recording apparatus, a recording system and a reproducing system which are arranged between the electro-magnetic transducer and the IC memory, a magnetic detector to detect magnetism in an erasing head of the magnetic tape recording apparatus and a semiconductor switching circuit for switching from the recording system to the reproducing system and vice versa on the basis of a signal from the magnetism detecting element.

5 Claims, 3 Drawing Sheets

CASSETTE FOR STORING DATA IN A SOLID STATE MEMORY IN LIEU OF TAPE

BACKGROUND OF THE INVENTION

1. Field of the Invention

The present invention relates to a cassette type recording unit. More particularly, it relates to a cassette type recording unit containing a solid-state memory, an electro-magnetic transducing element, a magnetism detecting element to detect magnetism in an erasing head and a switching circuit for switching the operations of recording and reproducing, whereby recording and reproducing can be automatically performed with use of an ordinally magnetic tape cassette type magnetic tape recording apparatus.

2. Discussion of Background

FIG. 3 is a plane view partly cross-sectioned of a magnetic tape cassette which has been widely used, wherein a reference numeral 1 designates a casing, numerals 2 designate a pair of hubs 10 disposed in the casing 1, numerals 3 designates the openings of the hubs 2 and a numeral 4 designates a magnetic tape. A window 6 for pinch roller a window 7 for recording/reproducing head, an aperture 8 for capstan and a window 9 for erasing head are respectively formed in the front face of the magnetic tape cassette, the front face constituting an area for permitting the transport of the magnetic tape 4. Further, guide pins 10 and a guide roller 11 are also formed in the casing 1 to thereby give stable running or transport of the magnetic tape 4. When the magnetic tape cassette is mounted on a tape cassette type magnetic tape recording apparatus to conduct recording or reproducing, guide posts formed in the recording apparatus are inserted in reference holes 5 formed at both sides of the magnetic tape cassette, and pawls formed on the hub driving shafts of the recording apparatus are meshed with six pins formed in the openings 3 of the hubs, whereby a rotational force is applied to the hubs 2. Further, a capstan shaft of the recording apparatus is fitted to the aperture 8 of capstan, and a pinch roller pushes the magnetic tape 4 to the capstan through the window 6 for pinch roller. The rotation of the hubs 2 moves the magnetic tape 4 under the condition that the magnetic tape 4 is held by the pinch roller and the capstan. When the magnetic tape runs in contact with the recording/reproducing head RW of the recording apparatus, which enters in the window 7 for the recording/reproducing head, a magnetization pattern is formed in the magnetic tape 4 due to a change of magnetism in response to a signal current to the magnetic head, whereby the recording is magnetically performed in the magnetic tape 4.

Prior to the recording of the magnetic tape 4 by the recording/reproducing head RW, data recorded on the magnetic tape 4 are erased by means of an erasing head IH of the recording apparatus. As the erasing head IH, there have been known two kinds of erasing head: one formed by a permanent magnet which is in contact with the magnetic tape 4 in recording operations and is separated from the magnetic tape 4 in reproducing operations, and the other which is normally in contact with the magnetic tape, wherein it is excited by supplying an erasing current in recording operations and is deenergized by interrupting the erasing current in reproducing operations.

In the reproducing operations, the magnetic tape on which data are recorded is caused to run while it is brought into contact with the recording/reproducing head RW. Then, an electromotive force is produced in the coil of the recording/reproducing head RW in response to changes in a magnetic flux generated from the magnetic tape. Thus, an output for reproducing the data is obtainable.

In the conventional magnetic tape cassette having the magnetic tape 4 as a recording medium, the breaking or the twisting of the magnetic tape 4 or jamming of the tape 4 due to irregularity of during winding may take place. It results in the construction of the magnetic tape cassette having the magnetic tape 4. In the case of bad conditions during stocking the magnetic tape, curling or elongation is caused in the magnetic tape, or the quality of recorded data changes by the influence of magnetism.

SUMMARY OF THE INVENTION

It is an object of the present invention to provide a cassette type recording unit capable of recording or reproducing by using a conventionally used magnetic tape cassette type magnetic tape recording apparatus.

The foregoing and other objects of the present invention have been attained by providing a cassette casing capable of being fitted to a magnetic tape cassette type magnetic type recording apparatus, with a solid-state memory, an electro-magnetic transducing element capable of magnetically coupling to a recording/reproducing head of the magnetic tape recording apparatus, a recording system and a reproducing system which are arranged between the electro-magnetic transducing element and the solid-state memory, a magnetism detecting element to detect magnetism in an erasing head in the magnetic tape recording apparatus, and a switching circuit for switching from the recording system to the reproducing system and vice versa on the basis of a signal from the magnetism detecting element.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF PREFERRED EMBODIMENT

Figure 1:
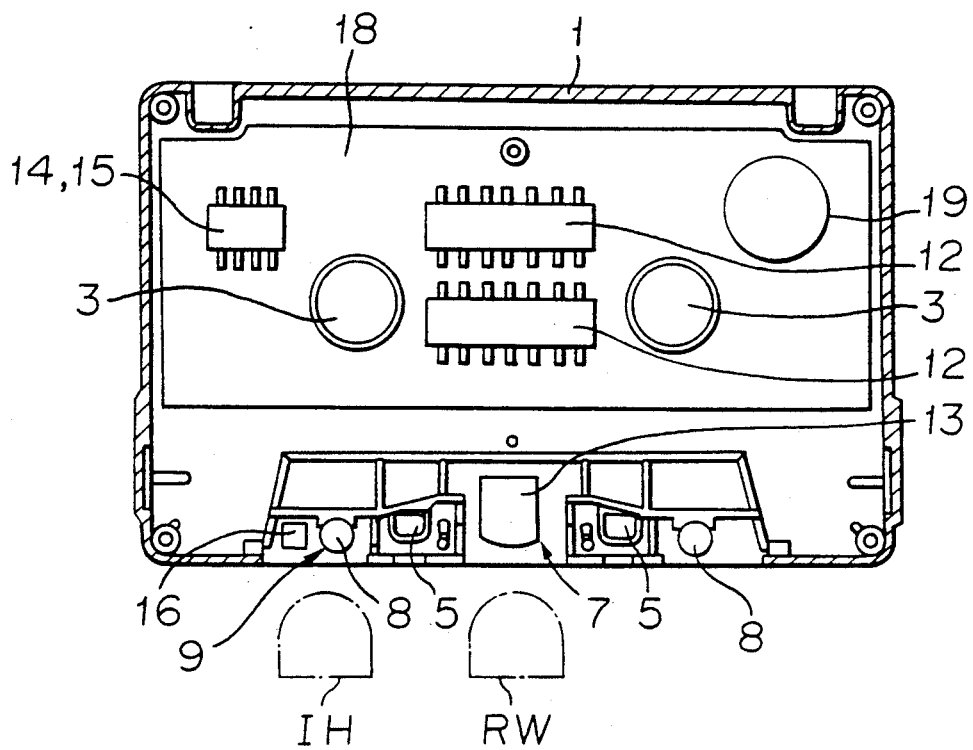
FIG. 1 is a plane view partly cross-sectioned of an embodiment of the cassette type recording unit according to the present invention.
Figure 2:
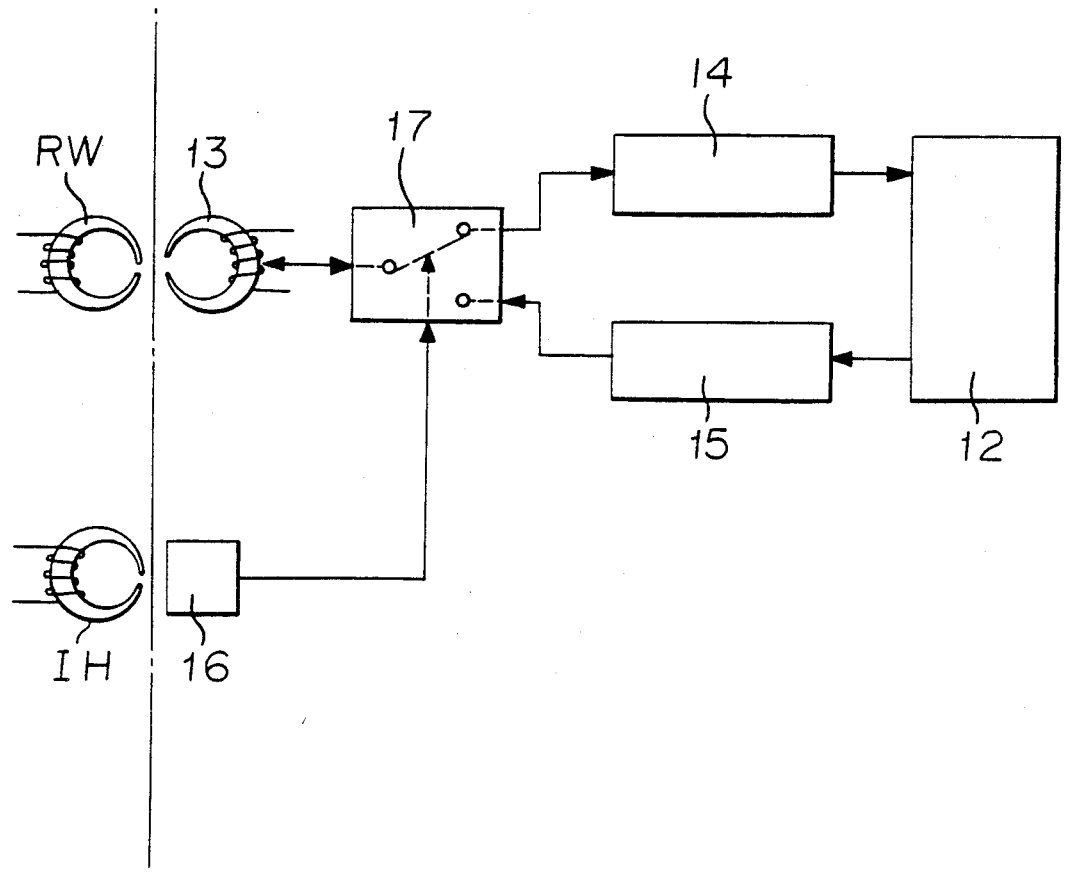
FIG. 2 is a diagram of an embodiment of the electric circuit of the recording unit.
Figure 3:
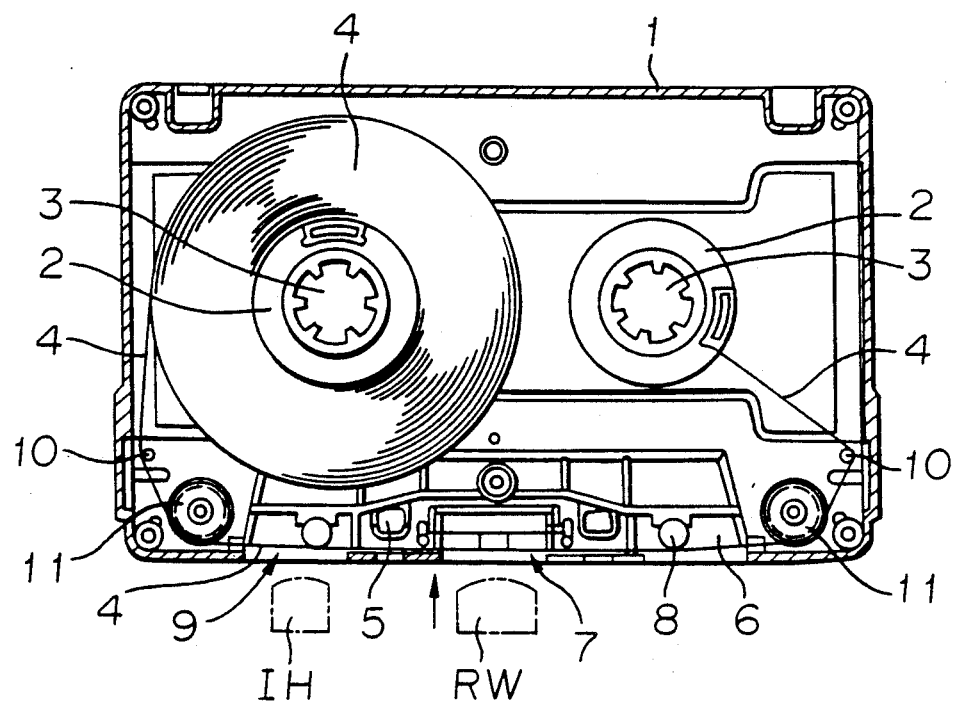
FIG. 3 is a plane view partly cross-sectioned of a conventional magnetic tape cassette.

Referring to the drawings, wherein the same reference numerals designate the same or corresponding parts in the views, and more particularly to FIG. 1 thereof, there is shown a plane view partly cross-sectioned of an embodiment of the cassette type recording unit of the present invention. In FIG. 1, a reference numeral 1 designates a cassette casing which is the same shape as the conventional magnetic tape cassette casing so that it can be fitted to a conventional magnetic tape recording apparatus. The casing 1 contains a solid-state memory 12, formed by an IC memory, or the like, a electro-magnetic transducing element 13, a recording system 14, a reproducing system 15 a magnetism detecting element 16 and a switching circuit 17, as best seen in FIG. 2. In FIG. 1, a reference numeral 18 designates a circuit board and a numeral 19 designates a power source device.

The electro-magnetic transducing element 13 is disposed at a window 7 for receiving a recording/reproducing RW, the element 13 being formed at the front face of the cassette casing 1 so that it can be magnetically coupled to a recording/reproducing head of the recording apparatus. The electro-magnetic transducing element 13 typically has a construction such that a winding is mounted on a core having a gap in the same manner as the recording/reproducing head RW.

The recording system 14 and the reproducing system 15 are provided between the solid-state memory 12 and the electro-magnetic transducing element 13. The recording system 14 amplifies an analogue signal from the electro-magnetic transducing element 13 to convert the analogue signal into a digital signal as an output. The reproducing system 15 transforms a digital signal read from solid-state memory 12 into an analogue signal as an output.

The magnetism detecting element 16 is disposed at or near a window 9 for receiving an erasing head IH so that the magnetic flux of the erasing head IH, composed of a permanent magnet, is detected. A magneto-electric transducing element such as a magnet switch, a pawl element and so on, or a magnetic head may be used for the magnetism detecting element 16.

As best seen in FIG. 2, the switching circuit 17 switches between the operation of the recording system 14 and the reproducing system 15 on the basis of a signal from the magnetism detecting element 16. The switching circuit 17 may be formed by a semiconductor switching circuit or a suitable device.

The power source device 19 may be generally a battery. However, it may be constituted by a generator which is obtained by utilizing a rotational force of the capstan or the pinch roller, in the cassette casing 1. Further, power can be supplied from the side of the recording apparatus by electrically connecting a terminal of the cassette type recording unit to the power source of the recording apparatus when the cassette type recording unit is mounted on the recording apparatus.

When the cassette type recording unit having the above-mentioned construction of the present invention is mounted on a magnetic tape cassette type recording apparatus, guide posts are inserted in reference holes 5 formed at both sides of the casing 1; the magnetism-electricity transducing element 13 is magnetically coupled to the recording/reproducing head RW of the recording apparatus through the window 7 for recording/reproducing head, and the magnetism detecting element 16 opposes the erasing head IH at the window 9 for erasing head.

In the recording operations, a magnetic field for erasing which is produced by the erasing head IH is detected by the magnetism detecting element 16, and the switching circuit 17 is changed over to connect the recording system 14 on the basis of a signal from the magnetism detecting element 16. A signal transformed into a change of magnetism by the recording/reproducing head RW is again transformed into an electric signal by means of the electro-magnetic transducing element 13. The analogue signal is amplified by the recording system 14 and at the same time is transformed into a digital signal to be written and stored in the solid-state memory 12.

When the magnetic field of the erasing head IH to be detected by the magnetism detecting element 16 is no longer detected, the switching circuit 17 operates to connect the reproducing system 15 to the memory 12. The digital signal read from the solid-state memory 12 is transformed into an analogue signal by the reproducing system 15, which is supplied to the electro-magnetic transducing element 13 through the switching circuit 17. The magnetism-electricity transducing element 13 transforms the analogue signal into a change of magnetism corresponding to the electric signal. Then, the change of magnetism is transformed into an electric signal by the recording/reproducing head RW which is magnetically coupled to the electro-magnetic transducing element 13.

Thus, in accordance with the magnetic tape cassette type recording unit of the present invention, the following advantages are obtainable.

(a) The cassette casing capable of being fitted to the conventional magnetic tape cassette type magnetic tape recording apparatus contains the solid-state memory, the magnetism-electricity transducing element capable of magnetically coupling to the recording/reproducing head of the recording apparatus, the recording system and the reproducing system, the systems being disposed between the electro-magnetic transducing element and the solid-state memory. Accordingly, the cassette type recording unit of the present invention can record and reproduce data by the conventional magnetic tape cassette type magnetic tape recording apparatus which has been widely used.

(b) Since the cassette type recording unit of the present invention has the magnetism detecting element for detecting magnetism in the erasing head of the conventional magnetic tape recording apparatus and the switching circuit for switching the operations between the recording system and the reproducing system on the basis of a signal from the magnetism detecting element, the operation of recording or the operation of reproducing can be automatically changed.

(c) Troubles such as the stop of running, the twisting, the breaking, the elongation of the magnetic tape do not occur because the solid-state memory is used as a recording medium.

(d) Use of the solid-state memory does not cause an undesired change of data recorded therein even though the cassette type recording unit is placed under bad condition of stock or use unlike the conventional magnetic tape cassette containing a magnetic tape.

(e) Use of the solid-state memory reduces the scattering of data recorded in the recording unit and provides uniform products.

(f) The cassette type recording unit of the present invention is useful for a device which requires short time recording or reproducing such as telephone services, automatic answering telephones instead of the conventional endless magnetic tape cassette.

Obviously, numerous modifications and variations of the present invention are possible in light of the above teachings. It is therefore to be understood that within the scope of the appended claims, the invention may be practiced otherwise than as specifically described herein.

What is claimed is:

1. A cassette for use with a conventional magnetic tape cassette type, magnetic tape recording apparatus having a recording/reproducing head and an erasing head which provides a magnetic flux during a recording operation of the magnetic tape recording apparatus, the cassette comprising:

a casing for attachment to the magnetic tape recording apparatus, a solid state memory, within the casing, for storing data, an electro-magnetic transducing element for magnetic coupling to the recording/reproducing head of the magnetic tape recording apparatus to sense data signals generated by the recording/reproducing head during the recording operation and for providing data signals for sensing by the recording/reproducing head during a reproducing operation, a recording system for converting the data signals sensed by the transducing element into data for storage by the memory and a reproducing system for converting data read from the memory into data signals to be provided to the transducing element during the reproducing operation, the recording and reproducing systems respectively being connected between the electro-magnetic transducing element and the solid state memory, magnetism detecting element for detecting the magnetic flux of the erasing head of the magnetic tape recording apparatus, and a switching circuit for switching between the recording system and the reproducing system on the basis of a signal from the magnetism detecting element, wherein the switching circuit connects the recording system between the electro-magnetic transducing element and the memory when the magnetism detecting element detects the magnetic flux of the erasing head and connects the reproducing system between the transducing element and the memory when the magnetism detecting element fails to detect the magnetic flux of the erasing head.

2. The cassette type recording unit according to claim 1, wherein the magnetism detecting element is a magnetic switch, a hole element or a magnetic head.

3. The cassette type recording unit according to claim 1, wherein the switching circuit is a semiconductor switching circuit.

4. The cassette type recording unit according to claim 1, wherein the magnetism detecting element is disposed at or near a window for the erasing head so as to face the erasing head.

5. A cassette for use with a conventional magnetic tape cassette type, magnetic tape recording apparatus for performing one of a recording operation and a reproducing operation, the apparatus having a recording/reproducing head, the cassette comprising:

a casing for attachment to the magnetic tape recording apparatus;

a solid-state memory, within the casing, for storing data;

an electro-magnetic transducing element for magnetic coupling to the recording/reproducing head of the magnetic tape recording apparatus to sense data signals generated by the recording/reproducing head during the recording operation of the apparatus and for providing data signals for sensing by the recording/reproducing head during the reproducing operation of the apparatus;

a recording system for converting the data signals sensed by the transducing element into data for storage by the memory and a reproducing system for converting data read from the memory into data signals to be provided to the transducing element during the reproducing operation, the recording and reproducing systems respectively being connected between the electro-magnetic transducing element and the solid state memory;

a recording operation detecting element for detecting the recording operation of the magnetic tape recording apparatus; and a switching circuit for switching between the recording system and the reproducing system on the basis of a signal from the recording operation detecting element;

wherein the switching circuit connects the recording system between the electro-magnetic transducing element and the memory when the detecting element detects the recording operation of the apparatus and connects the reproducing system between the transducing element and the memory when the detecting element fails to detect the recording operation of the apparatus.

* * * * *